United States Patent [19]

Koo et al.

[11] Patent Number: 4,742,293
[45] Date of Patent: May 3, 1988

[54] PSEUDO-MEMORY CIRCUIT FOR TESTING FOR STUCK OPEN FAULTS

[75] Inventors: Frances D. Koo, Los Angeles; Gene W. Lee, Huntington Beach, both of Calif.

[73] Assignee: Hughes Aircraft Company, Los Angeles, Calif.

[21] Appl. No.: 34,973

[22] Filed: Apr. 6, 1987

[51] Int. Cl.$^4$ ............................................. G01R 31/28
[52] U.S. Cl. ..................................... 324/73 R; 371/25
[58] Field of Search ........................ 324/73 R, 73 AT; 371/25; 307/272 A, 272 R; 328/105

[56] References Cited

U.S. PATENT DOCUMENTS 4,697,279 9/1987 Baratti et al. ...................... 377/77 X
4,703,257 10/1987 Nishida et al. ............. 324/158 R X

OTHER PUBLICATIONS

Intl. Test Conference, Nov. 1985, Craig et al., "Pseudo-Exhaustive Adjacency Testing . . . ", pp. 126-137.

Primary Examiner—Reinhard J. Eisenzopf
Assistant Examiner—Stephen M. Baker
Attorney, Agent, or Firm—Ronald L. Taylor; A. W. Karambelas

[57] ABSTRACT

A method and apparatus are disclosed for testing for stuck- open faults in integrated circuits (10) having a plurality of combinational logic devices (18, 20). The apparatus includes a chain of shift register stages (22), with each stage including at least two latches (L1 and L3). The bits of an initialization test are shifted down the shift register and loaded into one of the latches (L3), while the bits of a detection test pattern are subsequently shifted down the chain and stored in the other latch (L1). A multiplexer (50) is provided for selecting one of the outputs from the two latches (L1, L3) so that the initialization test pattern and then the detection test pattern can be quickly applied to the combinational logic so as to minimize hazards which could invalidate the test results.

15 Claims, 3 Drawing Sheets

PSEUDO-MEMORY CIRCUIT FOR TESTING FOR STUCK OPEN FAULTS

TECHNICAL FIELD

This invention relates to techniques for testing integrated circuit devices and, more particularly, to methods and apparatus for testing for stuck-open faults in logic devices such as CMOS gates.

BACKGROUND

The substantial advances in integrated circuit technology have resulted in large scale integration (LSI) and very large scale integration (VLSI) circuit structures wherein literally hundreds of logic devices are placed on a single silicon chip. However, such high levels of integration present substantial problems in debugging and testing of these integrated circuits. Due to the nature of the highly integrated circuitry, internal nodes cannot be directly accessed and therefore specific internal circuitry cannot be directly tested. Such circuits therefore can generally only be tested by transmitting and receiving signals through external input/output (I/O) terminals of the circuit.

In an attempt to overcome this problem, the use of set/scan registers has been suggested wherein the internal storage elements (e.g., latches) in the integrated circuit are configured so that they can be selectively controlled to operate as shift registers for test purposes. For testing, some of the shift register stages are configured to provide inputs to the combinational logic network to be tested while other shift register stages are configured to accept and store outputs from the combinational logic network in response to the applied test patterns. These outputs are later shifted through the shift register chain to external apparatus for analyzing the test results. The following documents generally relate to the development of set/scan registers and are hereby incorporated by reference: (1) Eichelberger et al, "A Logic Design Structure for LSI Testability", Proc. 14th Design Automation Conference, New Orleans, June 20-22, (1977) pp. 462-468; (2) U.S. patent application Ser. No. 694,931 now U.S. Pat. No. 4,697,279 entitled "Test/Master/Slave Triple Latch Flip-Flop" by Baratti et al, filed 11/4/85 which is assigned to the assignee of the present invention; and (3) Craig et al, "Pseudo-Exhaustive Adjacency Testing: a BIST Approach for Stuck-Open Faults", International Test Conference, November (1985).

CMOS is rapidly becoming a dominant logic technology for VLSI circuits. One of the testing challenges for CMOS circuit implementation is the detection of stuck-open faults which have been shown to cause combinational circuits to exhibit sequential behavior. The most common approach for testing for stuck-open faults employs a two-pattern test. The first pattern is generally referred to as an initialization test pattern and it is used to drive the output of the devices or gates under test to a given logic state. The second test pattern is generally referred to as a detection test pattern and it is used to activate one path to VDD or ground through the devices under test. If the device under test is stuck open, the device will exhibit a memory property and the output of the device will remain at the value stored during the initialization test pattern. On the other hand, if the device is operating properly it will change state.

It has recently been shown that the two-pattern test must be chosen carefully so that the tests are not invalidated by time-skews in input variable changes or unequal path delays. The invalidation generally occurs when certain function hazards in the faulty circuit or static hazards are excited during the transition from the initialization test pattern to the detection test pattern. Such hazards tend to momentarily close a spurious path to ground in parallel with the device under test and potentially cause the appearance of correct behavior when the device actually has a stuck-open fault. Invalidation of the test results can also potentially occur if a path is closed to a large isolated capacitance, appropriately charged or discharged, within a complex gate. In gates with drive transmission gates, it is also possible for a charge node to extend outside of the gate under test.

SUMMARY OF THE INVENTION

The present invention provides improved set/scan circuitry and methodology which provide a robust test of combinational logic networks utilizing a two-pattern test technique utilizing an initialization test pattern followed by a second detection test pattern.

In the preferred embodiment, each shift register stage is provided with two latches, a first latch for storing a bit of the initialization test pattern, and a second latch for storing a bit of the detection test pattern. Means are provided for loading the multi-bit initialization test pattern into the shift register chain until each bit is stored in the first latch of each stage. Then, the detection test pattern is loaded by shifting bits thereof down the chain until each bit is loaded into the second latch in each stage. As a result, the shift register chain has the entire initialization test pattern and detection test pattern stored in the two latches. By appropriately controlling multiplexers coupled to these latches, it is possible to rapidly apply the initialization test pattern and then the detection test pattern to the combinational logic thereby minimizing hazards which could invalidate the test results.

BRIEF DESCRIPTION OF THE DRAWINGS

The various advantages of the present invention will become apparent to those skilled in the art by reference to the following specification and the drawings in which.

DESCRIPTION OF THE PREFERRED EMBODIMENT

Figure 1:
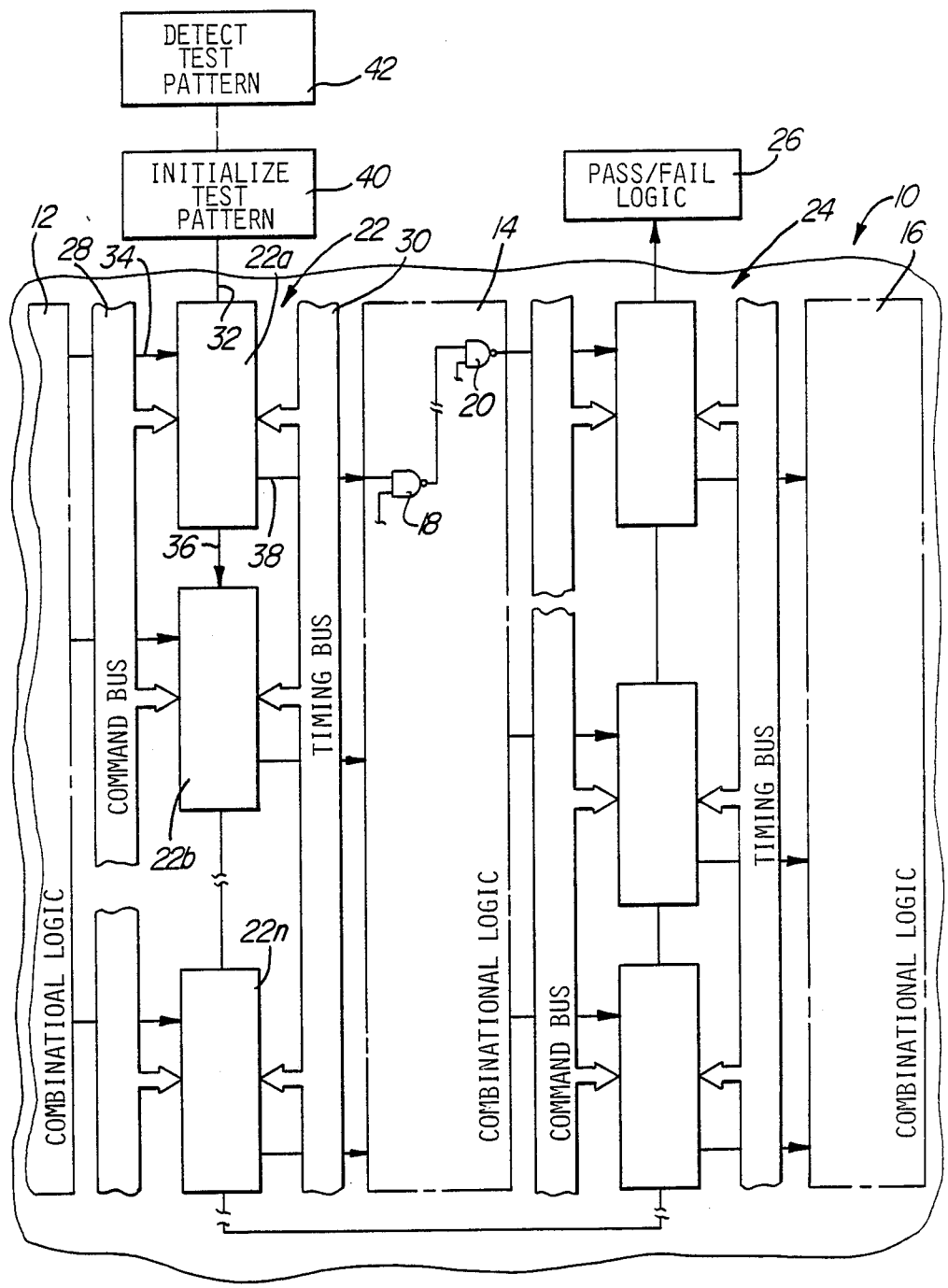
FIG. 1 schematically illustrates circuitry for carrying out the teachings of the present invention.

FIG. 1 schematically illustrates the organization of an integrated circuit chip 10 having blocks 12, 14 and 16 each containing a plurality of combinational logic devices. In FIG. 1, two such devices are shown in block 14 as CMOS NAND gates 18 and 20. However, it should be understood that the integrated circuit device 10 normally will contain hundreds or thousands of such gates in practice, including other logic gates as well as NAND gates. Each of the combinational logic blocks are flanked by a chain of shift register stages. One chain of shift register stages is used to apply test patterns to the combinational logic, while the other chain is used to receive the outputs of the test. For ease in understanding the present invention, it will be described in connection with shift register 22 which is used to apply the test patterns to combinational logic box 14 and shift register 24 which accepts the results of the test. The results are later shifted through the register 24 and observed by suitable pass/fail logic 26 which evaluates the test results.

Each of the shift registers 22, 24 are essentially the same. They include a plurality of interconnected stages and associated command and timing busses. For example, shift register 22 includes stages 22(a) to 22(n), command bus 28 and timing bus 30. The inputs to each stage include a line 32 labeled SCAN-IN and a line 34 labeled CIRCUIT-IN. The outputs for each stage include a line 36 labeled SCAN-OUT and a line 38 labeled CIRCUIT-OUT. The input line 32 for stage 22(a) is connected to external devices that store and load the initialization test pattern and the detection test pattern into the shift register 22. In FIG. 1, these devices respectively bear the numerals 40 and 42 for the initialization and detection test patterns. The present invention is not overly concerned with the specifics of the test patterns. Suffice it to say that each of the test patterns comprise a multi-bit arrangement of data designed to apply a given logic state to a particular combinational logic device. Each of the test patterns take the form of bit serial data which can be loaded sequentially into the shift register 22. This will be explained in more detail later herein.

Figure 2:
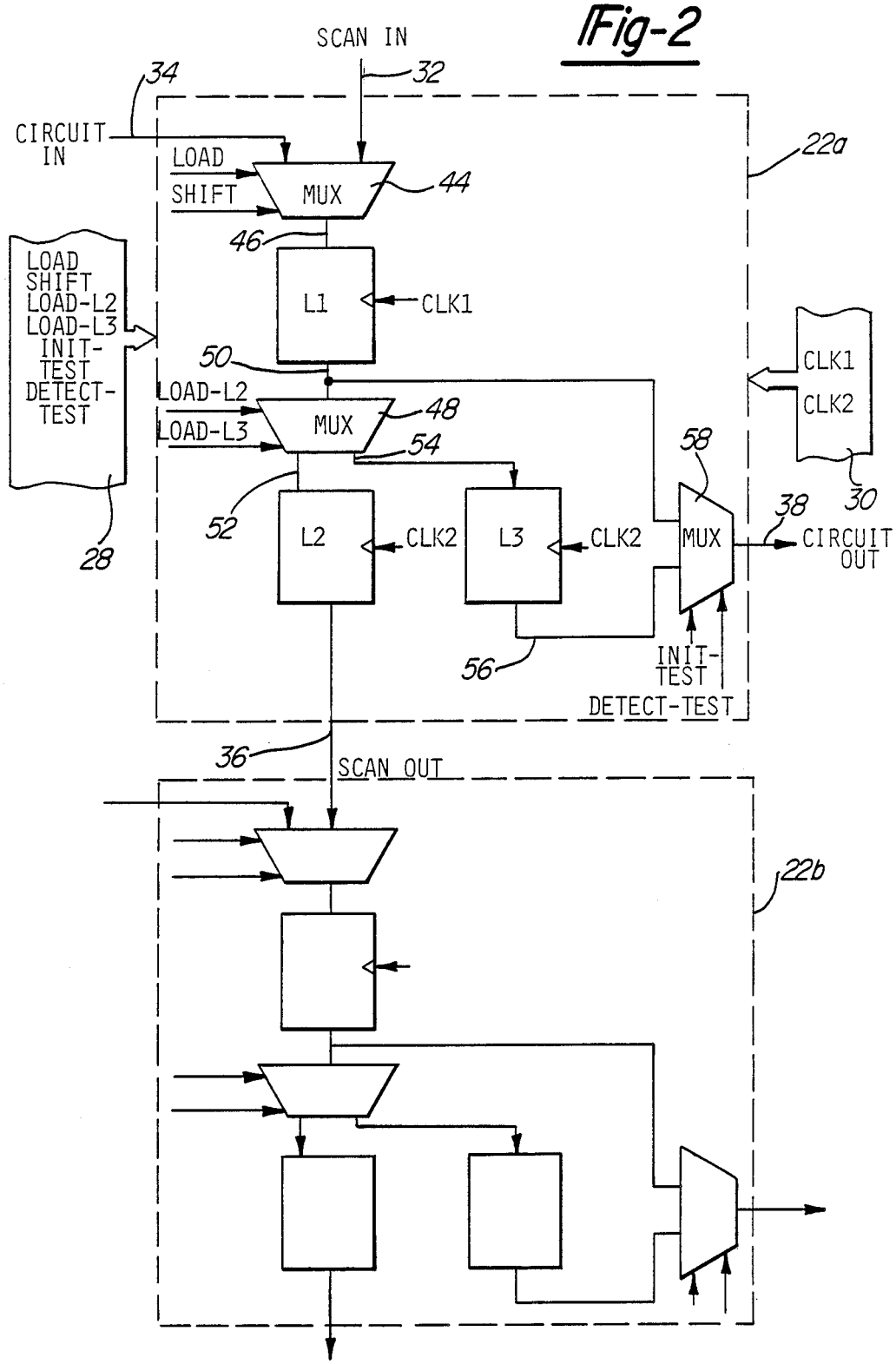
FIG. 2 is a schematic diagram particularly illustrating the circuitry of two shift register stages in accordance with the teachings of the present invention.

FIG. 2 illustrates in more detail the circuitry for each shift register stage. As noted before, each stage is essentially the same and therefore a description of the circuitry for stage 22(a) will be sufficient. The input lines 32 and 34 are fed into the inputs of a multiplexer 44 having an output coupled to an input of a latch L1. The multiplexers and latches used in the present invention are known per se. As is well known, a multiplexer such as multiplexer 44 operates to selectively connect its input(s) to its output(s) depending upon the state of control signals or commands applied to its select inputs. In this embodiment, the commands are provided over command bus 28 and are labeled LOAD and SHIFT. The presence of the LOAD signal will cause the contents on input line 34 to be coupled to the multiplexer output 46 and then loaded or stored into latch L1 during the next occurring clock pulse labeled CLK1 from timing bus 30. On the other hand, an appropriate control signal on the SHIFT select input to multiplexer 44 will cause it to couple the SCAN-IN line 32 to its output 46.

Multiplexer 48 operates in a similar manner but in reverse (and, consequently, is sometimes referred to as a demultiplexer). Multiplexer 48 will couple its input line 50 to one of its output lines 52 or 54 depending upon the presence of the LOAD-L2 or LOAD-L3 select commands. Thus, the output of multiplexer 48 is used to either load latch L2 or latch L3. The output of latch L2 is coupled to the SCAN-OUT output line 36 for stage 22(a) which is connected to the SCAN-IN input line 32 of the next shift register stage 22(b) in the chain. The output 56 from latch L3 serves as one of two inputs to multiplexer 58. The other input of multiplexer 58 is from the output 50 from latch L1. The output of multiplexer 58 serves as the output line 38 labeled CIRCUIT-OUT. Each stage 22 can perform five functions:

(1) NORMAL OPERATIONS: read data from a gate in the combinational logic block (e.g., block 12 via line 34 for shift register stage 22(a));
(2) LOAD L2 LATCHES: shift data from the input 50 to the output 52; this function shifts and loads L2 latches;
(3) LOAD L3 LATCHES: this function shifts data through the register chain and latches the data in L3 from input 50 to 54;
(4) APPLY DETECTION TEST: apply the detection test pattern FROM L1 through mux 58 to the combinational logic (e.g., to the combinational logic block 14 via line 38 for stage 22(a));
(5) APPLY INITIALIZATION TEST: apply the initialization test pattern from L3.

The various functions can be performed by applying the appropriate command signals to the devices in each stage. The command signals are applied via bus 28 to the multiplexers as shown in FIG. 2. The convention that will be used for sake of simplicity in the following tables will be that an "OFF" state for a given command means that it does not activate the particular command-/signal whereas an "ON" state causes the signal/command to be active (and to operate as described above). Function 1 (NORMAL OPERATION) can be performed in connection with the commands in the following state:

| FUNCTION 1 | |
|---|---|
| "OFF" | "ON" |
| SHIFT | LOAD |
| LOAD-L2 | DETECT-TEST |
| LOAD-L3 | |
| INIT-TEST | |

Figure 3:
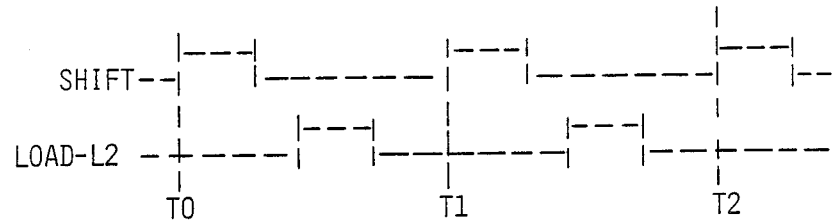
FIG. 3 is a waveform diagram illustrating the timing of commands for performing a given operation.

Function 2 (LOAD L2 LATCHES) is performed with the command lines in the states as set forth below, together with the application of the SHIFT and LOAD-L2 commands according to the timing relationship set forth in FIG. 3:

| FUNCTION 2 | |
|---|---|
| "OFF" | "ON" |
| LOAD | DETECT-TEST |
| LOAD-L3 | |
| INIT-TEST | |

Figure 4:
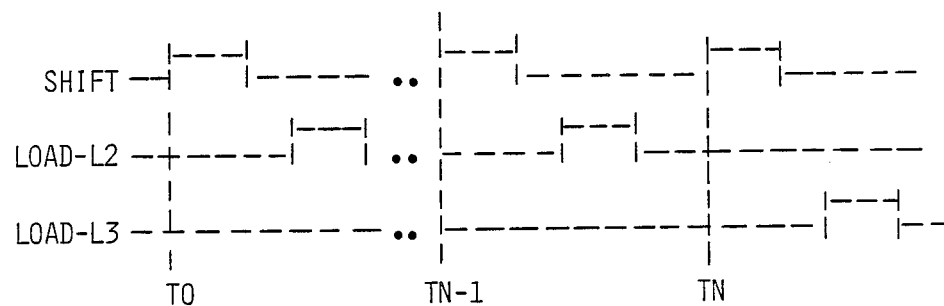
FIG. 4 is a waveform diagram illustrating the timing of given commands for performing another operation.

Function 3 (LOAD L3 LATCHES) is performed with the command lines at the states set forth below, together with the shift, LOAD-L2 and LOAD-L3 commands being applied according to the timing relationship in FIG. 4.

| FUNCTION 3 | |
|---|---|
| "OFF" | "ON" |
| LOAD | INIT-TEST |
| DETECT-TEST | |

Function 4 (APPLY DETECTION TEST) is accomplished by applying the DETECT-TEST command to multiplexer 58 while the other commands are in an "off" state as represented by the following table:

| FUNCTION 4 | |
|---|---|
| "OFF" | "ON" |
| SHIFT | DETECT-TEST |
| LOAD | |
| LOAD-L2 | |
| LOAD-L3 | |
| INIT-TEST | |

Analogously, the application of the initialization test pattern (Function 5) is accomplished by applying the command INIT-TEST to multiplexer 58 while the other commands are in an "off" state as illustrated below:

| FUNCTION 5 | |
|---|---|
| "OFF" | "ON" |
| SHIFT | INIT-TEST |
| LOAD | |
| LOAD-L2 | |
| LOAD-L3 | |

To maintain normal operation of the shift register 22, Function 1 can be used to load data from the combinational logic 12 (see FIG. 1). The data enters the shift register stages 22(a–n) in parallel as the CIRCUIT-IN signal (see FIG. 2). The data enters latch L1 through multiplexer 44. The output of latch L1 can be applied to combinational logic 14 as the signal CIRCUIT-OUT through multiplexer 58.

According to the method of the invention, the initialization test pattern is scanned in, i.e., loaded into the shift register 22 so that one bit of the initialization test pattern is stored in each latch L3 of the shift register stages 22(a–n). This is accomplished by Function 3 (see FIG. 4). As a result, the initialization test pattern is now stored in all of the L3 latches in the shift register stages 22(a–n).

The next step is to then load the detection test pattern from the storage device 42 into the shift register stages. This is accomplished by setting the command lines as set forth above in connection with Function 2 and applying the other commands in the timing relationship shown in FIG. 3.

It can be appreciated that the shift register stages 22(a–n) now contain the initialization test pattern and detection test pattern in latches L3 and L1, respectively. To apply the initialization test pattern, the command INIT-TEST is applied simultaneously to multiplexers 58 of all of the shift register stages 22(a) to 22(n). This causes the multibit test pattern to be simultaneously applied to all of the selected logic devices 18 in the combinational logic block 14. Quickly thereafter, the detection test pattern can be applied by using the DETECT-TEST command to switch multiplexer 58 so that it couples the output of latch L1 (containing the detection test pattern bit) to the CIRCUIT-OUT line 38 connected to the combinational logic. Since the initialization test pattern and detection test pattern can applied in quick succession, the chances for the occurrence of hazards which could invalidate the test results are minimized. After application of the detection test pattern, the output of the combinational logic gates are read by the shift register stages in shift register 24. The stored data is later shifted out of the shift register 24 into the pass/fail logic 26 where the test results can be analyzed.

In some cases, many pairs of test patterns can also be applied for testing the combinational logic. If an additional detection test pattern is designed to be utilized with the same initialization test pattern used in connection with the previous detection test pattern, then it is not necessary to go to the additional step of reloading the initialization test pattern since it is already stored in the L3 latches.

Those skilled in the art will appreciate that the present invention provides some significant improvements to the state of the art in connection with testing for stuck-open faults. It should be understood that while this invention was described in connection with a particular example thereof, no limitation is intended thereby since the skilled practitioner will realize that other modifications can be made without departing from the spirit of this invention after studying the specification, drawings and following claims.

What is claimed is:

1. A method of testing for stuck-open faults in integrated circuits having a plurality of combinational logic devices, said method comprising:
   loading an initialization test pattern into a first latch in a stage in a chain of shift register stages;
   thereafter, loading a detection test pattern into a second latch in each of the stages; and
   multiplexing the first and second latches to apply the initialization test pattern and detection test pattern to the combinational logic in quick succession.

2. The method of claim 1 wherein said combinational logic comprises CMOS gates.

3. The method of claim 2 wherein the initialization and detection test patterns are each loaded by shifting bits thereof serially through stages of the shift register.

4. The method of claim 3 which further comprises the step of:
   reading outputs from the combinational logic in response to the applied test patterns.

5. The method of claim 1 which further comprises:
   reading the logical state of the combinational logic after the test patterns have been applied and storing the read data in a plurality of shift register stages; and
   thereafter, shifting the stored data out of the shift register stages for analyzing the test results.

6. Apparatus for testing for stuck-open faults in integrated circuits having a plurality of combinational logic devices, said apparatus comprising:
   a chain of shift register stages, each stage being substantially identical and including first and second latch means;
   means for loading a multibit initialization test pattern into the chain and storing a bit thereof in said first latch of each stage;
   means for thereafter loading a multibit detection test pattern into the chain and storing a bit thereof in said second latch of each stage;
   each stage further including multiplexer means having inputs coupled to outputs of said first and second latches, with an output coupled to a given combinational logic device; said multiplexer being adapted to connect its output to said first or second latch in response to given commands; and
   command means for generating a command sufficient to cause all of said multiplexer means in each of the latches to couple their outputs to the first latch whereby said initialization test pattern is simultaneously applied in parallel to a plurality of logic devices; and said command means being further operative to thereafter cause said multiplexers to simultaneously connect their outputs to said second latch means to thereby apply said detection test pattern to said combinational logic devices whereby said initialization and detection test patterns can be quickly applied so as to minimize hazards which could invalidate test results.

7. The apparatus of claim 6 wherein an input of a first stage in the chain is connected to a source for said initialization test pattern and a source for said detection test pattern; and said stage being constructed so as to permit data to be shifted from an input thereof through the stage to an input of another stage whereby the test patterns can be shifted through the various stages for loading into their respective latches.

8. The apparatus of claim 7 wherein each stage further comprises:

a plurality of data inputs including a first input for receiving data associated with the test patterns and a second input for receiving data associated with the combinational logic.

9. The apparatus of claim 8 wherein each stage includes:

a plurality of data outputs, a first output being connected to the combinational logic for applying the test patterns thereto and a second output which can be used to transfer data from one stage to the input of another stage.

10. In an integrated circuit having several blocks of CMOS gates, a chain of shift register stages interposed between each block, first storage means for storing a multibit initialization test pattern, and a second storage means for storing a multibit detection test pattern, the improvement wherein the shift register includes a plurality of substantially identical stages, each stage comprising:

a first data input which can be used to receive said test patterns;

a second data input connected to an output of a given CMOS gate;

a first data output connected to an input of a given CMOS gate;

a second output which can be used to couple the test patterns to other stages in the chain;

first multiplexer means having inputs coupled for receipt of said first and second data inputs of the stage;

first latch means having an input coupled to an output of the first multiplexer means;

second multiplexer means having an input coupled to an output of the first latch means, said second multiplexer means including first and second outputs thereof;

second latch means coupled to the first output of the second multiplexer means, the output of the second latch being connected to said second data output for the stage;

third latch means having an input coupled to the second output of the second multiplexer means;

third multiplexer means having an output coupled to the first output for the stage, said third multiplexer means having inputs thereof coupled to outputs of said first latch and said third latch; and command means for controlling the operation of said first, second and third multiplexers.

11. The improvement of claim 10 wherein said command means is operative to store said initialization test patterns in the third latch means of each of the shift register stages.

12. The improvement of claim 11 wherein said command means is operative to store said detection test pattern in the first latch means of said first register stages.

13. The improvement of claim 12 wherein said command means is adapted to control said third multiplexer means so as to first connect the output of the third latch means to the output of the third multiplexer whereby the initialization test pattern is simultaneously applied in parallel to CMOS gates of a given block; and wherein said command means is further operative to thereafter control said third multiplexer means to connect the output of the first latch means to its output whereby to apply said detection test pattern to the gates in the block.

14. The improvement of claim 10 wherein an output from a shift register stage is coupled to means for analyzing the test results.

15. The improvement of claim 14 wherein said command means is operative to cause the stage to read data from a given gate, and thereafter, to shift said data to the means for analyzing the test results.

* * * * *